United States Patent [19]

Almenräder et al.

[11] Patent Number: 5,053,854
[45] Date of Patent: Oct. 1, 1991

[54] SEMICONDUCTOR COMPONENTS

[75] Inventors: Peter Almenräder, Staufen; Jiri Dlouhy, Mägenwil; Jürg Fingerle, Boniswil; Otto Kuhn, Lupfig, all of Switzerland

[73] Assignee: BBC Brown Boveri AG, Baden, Switzerland

[21] Appl. No.: 164,902

[22] Filed: Mar. 7, 1988

[30] Foreign Application Priority Data

Mar. 25, 1987 [CH] Switzerland ............ 1138/87

[51] Int. Cl.$^5$ .................. H01L 23/10; H01L 23/08
[52] U.S. Cl. .................................. 357/79; 357/74; 357/76
[58] Field of Search ............ 357/76, 79, 74, 68

[56] References Cited

U.S. PATENT DOCUMENTS

| | | | |
|---|---|---|---|
| 4,263,607 | 4/1981 | Legrand et al. | 357/79 |
| 4,719,500 | 1/1988 | Tokunoh | 357/68 |
| 4,775,916 | 10/1988 | Kouzuchi et al. | 357/76 |

FOREIGN PATENT DOCUMENTS

| | | | |
|---|---|---|---|
| 0145632 | 8/1985 | Japan | 357/79 |
| 61-58742 | 3/1986 | Japan | . |
| 0062378 | 3/1988 | Japan | 357/79 |

Primary Examiner—Andrew J. James
Assistant Examiner—S. V. Clark
Attorney, Agent, or Firm—Oblon, Spivak, McClelland, Maier & Neustadt

[57] ABSTRACT

A semiconductor component including a semiconductor substrate having a main electrode and a control electrode. The main electrode includes a groove in which is inserted a U-shaped insulation body. The control electrode is disposed in the groove and is insulated from the main electrode by the insulation body. A spring is provided in the groove between the control electrode and the insulation body and presses the control electrode against the semiconductor substrate. In this way, the control electrode is displaceable with respect to the insulation body in a direction perpendicular to the main surface of the semiconductor substrate.

6 Claims, 1 Drawing Sheet

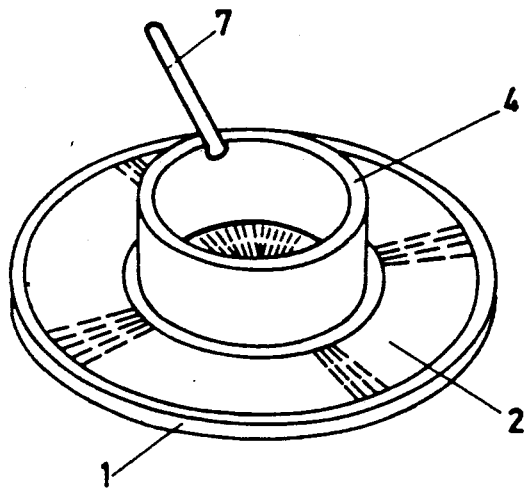
FIG.1
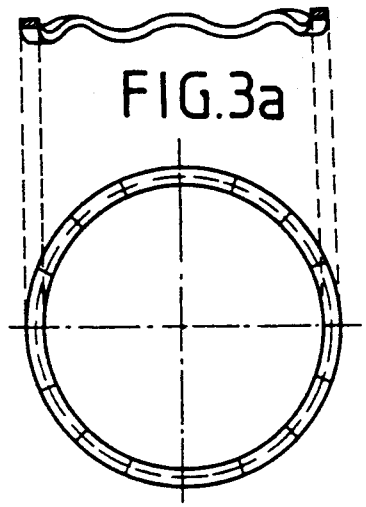
FIG.3a
FIG.3b
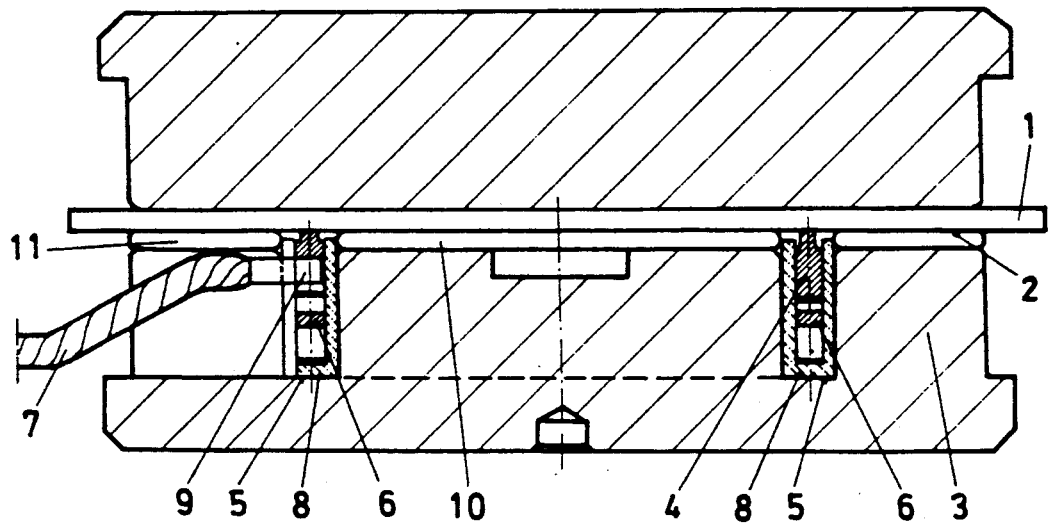
FIG.2

SEMICONDUCTOR COMPONENTS

BACKGROUND OF THE INVENTION

1. Field of the Invention

The invention relates to a semiconductor component, comprising a semiconductor substrate which exhibits on a main surface a contact area for a main electrode and a contact area for a control electrode, a main electrode and a contact electrode which are in contact with the semiconductor substrate, the main electrode exhibiting a groove in which the control electrode and a spring, which presses the control electrode against the semiconductor substrate, are accommodated, and a control electrode access line.

2. Discussion of Background

A number of controllable semiconductor components for relatively high power are characterized by the fact that high currents occur for a short time at the control electrode. These elements include, for example, the gate-turn-off (GTO) thyristor in which the high currents are required for turning off the element. It is of importance for the proper operation of such semiconductor components that the entire gate area of the semiconductor substrate is supplied without delay and uniformly with current. It has been found in the past that this can be achieved most easily by means of an annnularly constructed control electrode.

It is then a matter of finding an arrangement in which the contact areas for main and control electrode, located on the same main surface of the semiconductor substrate, can be accurately connected to main and control electrode.

Such a possible arrangement is disclosed in DE-A1 35 38 815. The corresponding component is described as follows:

A round semiconductor substrate has on a main surface a contact area for a main electrode and one such for a control electrode. The contact area for the control electrode is annular so that that for the main electrode is divided into two separate regions (a circle and an enclosing ring). The main electrode is a round plate which exhibits on the side facing the semiconductor substrate an annular groove wherein the annular control electrode is accommodated. The control electrode is displacable in the vertical direction in the groove and is held in contact with the semiconductor substrate by a spiral spring also accommodated in the groove.

A plastic film of fluorinated plastic applied to the control electrode is used as insulation between control and main electrode. The side of the control electrode facing the semiconductor substrate is left open in the plastic film and coated with silver for the purpose of improving the ohmic contact.

The control electrode is accessed via a line wire. Between the main electrode and the semiconductor substrate, a reinforcing plate of molybdenum is located which is also used for reducing thermal stresses in the semiconductor substrate.

The control electrode is produced as follows. A metal ring (for example of copper) having the required dimensions and tolerance is taken, the surface is masked in such a manner that the contact area to the semiconductor substrate and the connecting point for the line wire can be formed and the required plastic is sprayed on which forms the insulation film with respect to the main electrode. The line wire is soldered to the place provided for this purpose on the control electrode. The surface free of plastic facing the semiconductor substrate is coated with silver and tempered.

The problem of the semiconductor component just described, disclosed in DE-A1 35 38 815, lies in its inadequate mechanical ruggedness and in its expensive production method. This particularly applies to the control electrode. The coating with plastic is found to be risky in practice. On the one hand, the choice of plastic is restricted by the fact that it should adhere well to the metal surface of the control electrode and, on the other hand, a uniform crack-free film formation cannot be easily achieved. Furthermore, the masking technique is always associated with considerable expenditure.

SUMMARY OF THE INVENTION

The invention is based on the object of developing a semiconductor component in such a manner that the control electrode can be easily and accurately positioned, is held in uniformly distributed pressure contact with the semiconductor substrate and insulated from the main electrode in a simple and reliable manner.

A semiconductor component according to the invention comprises a semiconductor substrate which exhibits on a main surface both a contact area for a main electrode and one such for a control electrode, a main electrode and a control electrode which are in contact with the semiconductor substrate, and a control electrode access line. The main electrode exhibits a groove in which the control electrode and a spring, which presses the control electrode against the semiconductor substrate, are accommodated. An independent insulation body which is also located in the groove insulates the main electrode from the control electrode which can be moved relative to the insulation body.

The use of an independent insulation body provides great freedom in the choice of its material. It is no longer necessary to be restricted to plastics which adhere well to the metal control electrode. In addition, the production of the control electrode is considerably simplified since masking methods can be completely dispensed with.

In a preferred embodiment of the invention, the insulation body exhibits a U-shaped section so that it lines the groove in the manner of a jacket and projects from the groove with the two ends of the section. This allows molybdenum disks, which can be inserted as reinforcing plates between main electrode and semiconductor substrate, to be positioned in a simple and accurate manner.

BRIEF DESCRIPTION OF THE DRAWINGS

In the text which follows, the invention is explained with reference to an advantageous illustrative embodiment, referring to FIGS. 1-3 in which:

FIG. 1 shows a perspective representation of a semiconductor substrate with an annular control electrode, according to the prior art;

FIG. 2 shows an axial cross-section through an illustrative embodiment of a semiconductor component according to the invention;

FIG. 3a shows a section through an annular ondular spring; and

FIG. 3b shows a top view of the ondular spring.

In FIG. 1, a round semiconductor substrate 1 is shown in which a gate-turn-off thyristor has been placed in the conventional manner. This semiconductor substrate 1, corresponding to the prior art, exhibits on a main surface 2 a cathode area and a gate area which intermesh finger-like in known manner. The gate area is in contact with a likewise known annular control electrode 4. In addition, a control electrode access line 7 is indicated in FIG. 1.

Starting with this arrangement belonging to the prior art, the invention will be explained in an illustrative embodiment.

FIG. 2 shows an axial section through the illustrative embodiment, the elements just described being designated in the same manner.

A round metal plate, which exhibits a suitably shaped annular groove 5 is used as main electrode 3. Into the groove 5, an insulation body 8 is inserted which has a U-shaped section and thus lines the groove 5 in the manner of a jacket, during which process the part of the groove 5 now still available has become slightly smaller but has essentially retained its shape. Into the groove 5 equipped with the insulation body 8 an annular spring 6 is inserted, followed by the annular control electrode 4 which is dimensioned in such a manner that it lightly touches the insulating body 8 with its two side faces as a result of which its position relative to the main electrode 3, and thus also to the semiconductor substrate 1, is accurately determined in the horizontal direction but is still freely displacable in the vertical direction so that it can be pressed onto the semiconductor substrate 1 by the spring 6.

At a contact point 9 provided for this purpose, the control electrode is galvanically connected to a control electrode access line 7. A litz wire is preferably used as control electrode access line 7 so that an unnecessary mechanical loading of the contact point 9, which is, for example, hard soldered, can be avoided. To achieve optimum contact between the control electrode 4 and the semiconductor substrate 1, the surface of the control electrode 4 is subsequently provided with a layer of good conductivity. If the control electrode is, for example, of copper material, it is preferably coated with gold.

The insulation body 8 consists perferably of heat-resistant plastic (for example of the thermoplastic polymer granulate Ryton by Philips Petroleum) and can be produced, for example, by filling an injection mould. Its wall thickness should be selected in such a manner that it withstands the mechanical loading during the assembly without problems. A thickness of 0.8mm was selected in a successful illustrative embodiment.

In a preferred embodiment, a so-called ondular spring is used as spring 6 (FIG. 3a/3b). This is a ring which is raised in an ondular manner from a level base. Such an ondular spring can be produced in a simple manner, for example, from stainless spring steel or from BeCu. Its advantage lies in the fact that it requires very little space. In addition, it automatically distributes uniformly to its points of support the pressure occuring, because of the fact that its spring constants increase with increasing loading.

In another preferred embodiment of the subject-matter of the invention, the insulation body 8 is dimensioned in such a manner that it projects slightly from the groove 5 with the two ends of its U-shaped section (FIG. 2). An inner circular and an outer annular reinforcing plate (10/11) can be aligned in a simple manner on these concentric edges projecting past the surface of the main electrode 3, provided they are produced with the necessary accuracy.

To achieve the accurate positioning of the annular control electrode with respect to the gate area of the semiconductor substrate, which is important in the case of gate-turn-off thyristors, groove, insulation body and control electrode must be precisely matched to one another so that no unwanted horizontal displacements of the control electrode can occur during the assembly.

Whilst the control electrode must be suitably masked in the prior art in order to be able to apply insulation film and contact layer, such elaborate process steps are omitted in the production of the semiconductor component according to the invention.

The illustrative embodiment relates to the contacting of a semiconductor substrate for a gate-turn-off thyristor having an annular control electrode but this does not mean that the concept of the invention is only restricted to control electrodes of such shape or only to gate-turn-off thyristors. Instead, it can be applied to control electrodes of any shape of such semiconductor components in which a control electrode can be accommodated in a groove of a main electrode. Furthermore, the invention can be applied without restriction to components in which a plurality of control electrodes are arranged under a main electrode.

It can be finally said that the invention provides a semiconductor component which has a rugged construction and, furthermore, can be produced in a simple manner with the required precision.

What is claimed as new and desired to be secured by Letters Patent of the United States is:

1. Semiconductor component, comprising:
    a semiconductor substrate, which exhibits on a main surface a contact area for a main electrode and a contact area for a control electrode;
    a main electrode and a control electrode, which are in contact with the semiconductor substrate, wherein the main electrode exhibits a groove in which the control electrode is accommodated;
    a control electrode access line;
    a spring, which is accommodated in the groove and presses the control electrode against the semiconductor substrate;
    an independent insulation body consisting of a thermoplastic material insulating the control electrode against the main electrode;
    wherein:
    the control electrode is displaceable with respect to the insulation body in a direction perpendicular to the main surface of the semiconductor substrate;
    the insulation body is of a U-shaped section and lines the groove of the main electrode in the manner of a jacket; the insulation body projects from the groove with the ends of the U-shaped section; and
    the spring is located between the insulation body and the control electrode.

2. Semiconductor component, comprising:
    a semiconductor substrate, which exhibits on a main surface a contact area for a main electrode and a contact area for a control electrode;
    a main electrode and a control electrode, which are in contact with the semiconductor substrate, wherein the main electrode exhibits a groove in which the control electrode is accommodated;
    a control electrode access line;
    a spring, which is accommodated in the groove and presses the control electrode against the semiconductor substrate;
    an independent insulation body insulating the control electrode against the main electrode;
    wherein:

the control electrode is displaceable with respect to the insulation body in a direction perpendicular to the main surface of the semiconductor substrate;

the insulation body is of a U-shaped section and lines the groove of the main electrode in the manner of a jacket;

the insulation body projects from the groove with the ends of the U-shaped section; and the spring is located between the insulation body and the control electrode.

3. Semiconductor component, comprising:

a round semiconductor substrate, which exhibits on a main surface a contact area for a main electrode and a centrally symmetrically arranged contact area for a control electrode;

a main electrode and a control electrode, which are in contact with the semiconductor substrate, wherein the main electrode exhibits an annular groove in which the control electrode is accommodated;

a control electrode access line;

a spring, which is accommodated in the groove and presses the control electrode against the semiconductor substrate;

an independent insulation body insulating the control electrode against the main electrode;

wherein;

the control electrode is displaceable with respect to the insulation body in the direction perpendicular to the main surface of the semiconductor substrate;

the insulation body is of a U-shaped section and lines the groove of the main electrode in the manner of a jacket; and the spring is an ondular spring located between the insulation body and the control electrode.

4. Semiconductor component as claimed in claim 3, wherein the control electrode access line is a litz wire, which is connected to the control electrode by hard soldering.

5. Semiconductor component as claimed in claim 4, wherein the surface of the control electrode is provided with a conductive layer, in particular with a gold plating.

6. Semiconductor component as claimed in claim 3, wherein the ondular spring consists of stainless spring steel or of BeCu.

* * * * *